United States Patent
Lai

(10) Patent No.: US 8,247,832 B2
(45) Date of Patent: Aug. 21, 2012

(54) LIGHT EMITTING DIODE AND MANUFACTURING METHOD THEREOF

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 31 days.

(21) Appl. No.: 12/915,056

(22) Filed: Oct. 29, 2010

(65) Prior Publication Data

US 2011/0303937 A1      Dec. 15, 2011

(30) Foreign Application Priority Data

Jun. 11, 2010   (TW) .................................. 99119034

(51) Int. Cl.
*H01L 21/00* (2006.01)

(52) U.S. Cl. .............. 257/98; 257/79; 257/94; 257/103; 257/E33.064; 257/E33.072

(58) Field of Classification Search ..................... 257/79, 257/94, 98, 103, E33.064, E33.072
See application file for complete search history.

(56) References Cited

U.S. PATENT DOCUMENTS 8,106,412 B2 *   1/2012  Takao et al. ..................... 257/94

\* cited by examiner

*Primary Examiner* — Long Pham
(74) *Attorney, Agent, or Firm* — Altis Law Group, Inc.

(57) ABSTRACT

A light emitting diode includes a heat conductive substrate and a light emitting structure formed on the substrate. A transparent conductive layer is formed on the light emitting structure and an electrode pad is deposited on the transparent conductive layer. The light emitting diode further comprises a metal layer and a buffer layer set between the light emitting structure and the transparent conductive layer. The metal layer is set on the central portion of the top surface of the light emitting structure away from the substrate and forms a Schottky connection with the light emitting structure. The buffer layer surrounds the metal layer and forms an ohmic connection with the light emitting structure.

5 Claims, 5 Drawing Sheets

LIGHT EMITTING DIODE AND MANUFACTURING METHOD THEREOF

TECHNICAL FIELD

The disclosure generally relates to light emitting diode (LED), and a method for making the LED.

DESCRIPTION OF RELATED ART

In recent years, due to excellent light quality and high luminous efficiency, light emitting diodes (LEDs) have increasingly been used to substitute for cold cathode fluorescent lamps (CCFLs) as a light source of a backlight, and for incandescent bulbs or compact fluorescent lamps or fluorescent tubes as a light source of an illumination device.

A typical LED generally includes a p-type semiconductor layer, an active layer, and an n-type semiconductor layer. When a voltage is applied between the p-type semiconductor layer and the n-type semiconductor layer, electrons can recombine with holes within the active layer, releasing energy in the form of photons. Currently, a challenge to LED industry is to further enhance luminous efficiency of the LED. However, due to a small size of electrode of the LED, electric current spreading uniformly in the LED is difficult to achieve and this results in low luminous efficiency of the LED.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the LED and the method for manufacturing the LED will now be described in detail below and with reference to the drawings.

Figure 1:
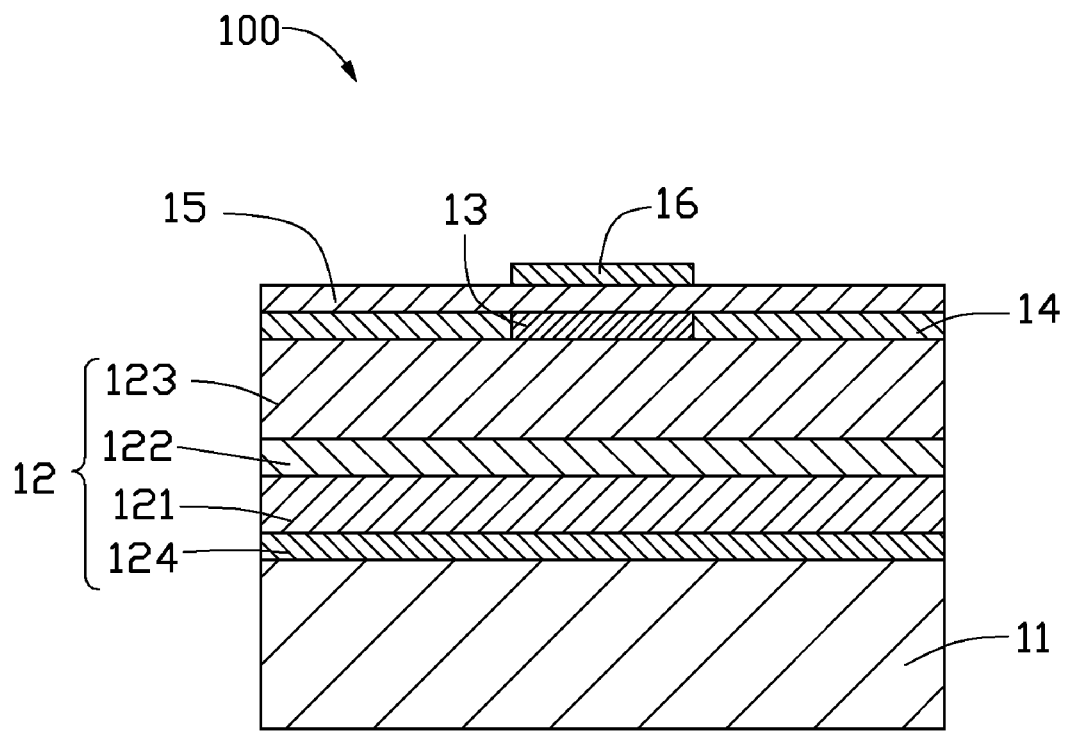
FIG. 1 is a cross-sectional view of an LED, in accordance with a first embodiment.

Referring to FIG. 1, an LED 100 in accordance with a first embodiment is shown. The LED 100 includes a heat conductive substrate 11 and a light emitting structure 12 formed on the substrate 11. A metal layer 13 and a buffer layer 14 are formed on the light emitting structure 12 and a transparent conductive layer 15 is formed on the metal layer 13 and the buffer layer 14. The metal layer 13 is on the central portion of the top surface of the light emitting structure 12 and the buffer layer 14 surrounds the metal layer 13. The LED 100 further includes an electrode pad 16 formed on the transparent conductive layer 15.

The heat conductive substrate 11 can be made of metal with high thermal conductivity, such as copper, aluminum, nickel, silver, gold, an alloy thereof, or any other suitable metal or alloy. In this embodiment, the heat conductive substrate 11 is made of nickel. In addition, the heat conductive substrate 11 can be a ceramic substrate such as a silicon substrate or germanium substrate.

The light emitting structure 12 includes a p-type GaN layer 121, an active layer 122 and an n-type GaN layer 123. The p-type GaN layer 121 is adjacent to the substrate 11 and the n-type GaN layer 123 is adjacent to the metal layer 13 and the buffer layer 14. When a voltage is applied between the p-type GaN layer 121 and the n-type GaN layer 123, electrons in the n-type GaN layer 123 and holes in the p-type GaN layer 121 will combine in the active layer 122, and energy is released in the form of light. In alternative embodiments, the light emitting structure 12 can also be made of AlGaN or InGaN.

In this embodiment, the light emitting structure 12 further includes a reflective layer 124 formed between the heat conductive substrate 11 and the p-type GaN layer 121 for reflecting light emitted from the active layer 122 to enhance the light extraction efficiency. The reflective layer 124 can be made of silver, nickel, aluminum, copper or gold, which can be deposited on the p-type GaN layer 121 by an electron beam, sputtering, vacuum metalizing or electroplating. In one alternative embodiment, the reflective layer 124 can also be a distributed Bragg reflector. The distributed Bragg reflector can be formed by alternately stacking two layers with different refractive index on the p-type GaN layer 121.

Figure 2:
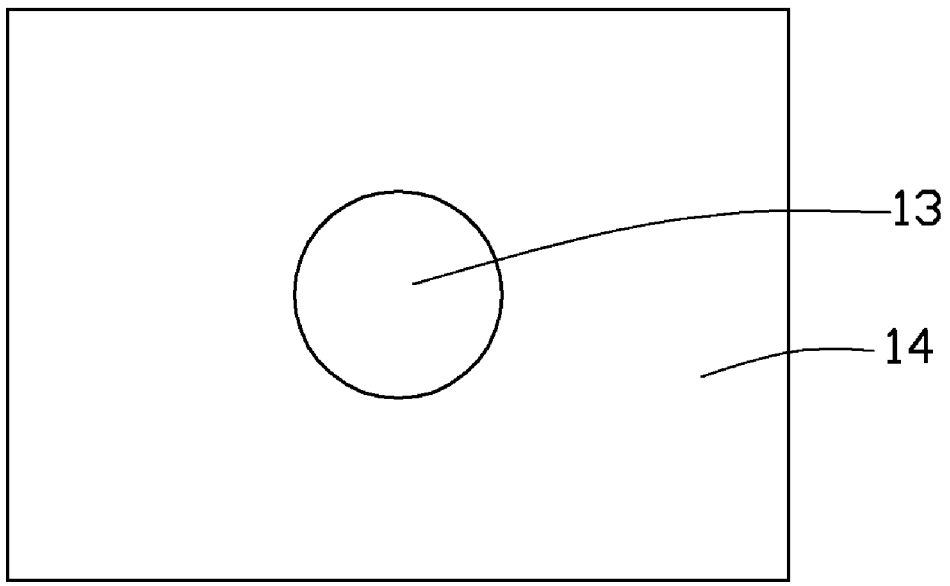
FIG. 2 is a top view of the LED with a metal layer and a buffer layer.

Referring to FIG. 2, the metal layer 13 is circular and formed on the central portion of top surface of the n-type GaN layer 123, and the metal layer 13 forms a Shottky connection with the n-type GaN layer 123. The buffer layer 14 surrounds the metal layer 13 and forms an ohmic connection with the n-type GaN layer 123. Because the electrical resistance of the Shottky connection is greater than that of the ohmic connection, the Shottky connection will inhibit current directly flow from the metal layer 13 to the n-type GaN layer 123. Therefore, when a voltage is applied to the LED 100, the current will first be distributed over the buffer layer 14 and then flow from the metal layer 13 and the buffer layer 14 to the n-type GaN layer 123, rather than directly flow from the metal layer 13 to the n-type GaN layer 123. Current crowding in the centre of the LED 100 can be avoided and a uniform current distribution flowing thorough the n-type GaN layer 123 is obtained. In addition, because metallic materials have relatively high reflectivity, the light from the active layer 122 to the electrode pad 16 will be reflected by the metal layer 13, and then reflected again by the reflective layer 124 and emit to the environment through the buffer layer 14. Accordingly, light from the active layer 122 would not be blocked by the electrode pad 16 and the light extraction efficiency is improved. The metal layer 13 can be made of copper, tin, zinc, nickel, aluminum or an alloy thereof. In this embodiment, the metal layer 13 is made of aluminum, which is deposited on the n-type GaN layer 123 by Plasma Enhanced Chemical Vapor Deposition (PECVD). A thickness of the metal layer 13 is in the range from 0.1 μm to 0.3 μm. The same as the metal layer 13, a thickness of the buffer layer 14 is also in the range from 0.1 μm to 0.3 μm. The buffer layer 14 is made of titanium or titanium oxide, which is also formed on the n-type GaN layer 123 by PECVD.

The transparent conductive layer 15 is deposited on the metal layer 13 and the buffer layer 14, which can further increase the distribution of the current applied to the light emitting structure 12. The transparent conductive layer 15 can be indium tin oxide (ITO) films, indium zinc oxide (IZO) films or ZnO films. In this embodiment, the transparent conductive layer 15 is made of indium tin oxide, which is formed on the metal layer 13 and the buffer layer 14 by sputtering. The thickness of the transparent conductive layer 15 is in the range from 0.1 μm to 0.5 μm.

The electrode pad 16 is deposited on the transparent conductive layer 15 for connecting to a power supply. The electrode pad 16 is made of silver, gold, copper or aluminum. In this embodiment, the electrode pad 16 is made of gold, which can be deposited by PECVD and has a thickness about 0.5 µm. The electrode pad 16 is located at a center of a top surface of the transparent conductive layer 15. The area of the electrode pad 16 is equal to that of the metal layer 13 in this embodiment. In an alternative embodiment, the area of the metal layer 13 can be greater than that of the electrode pad 16 for a better current distribution.

Figure 3:
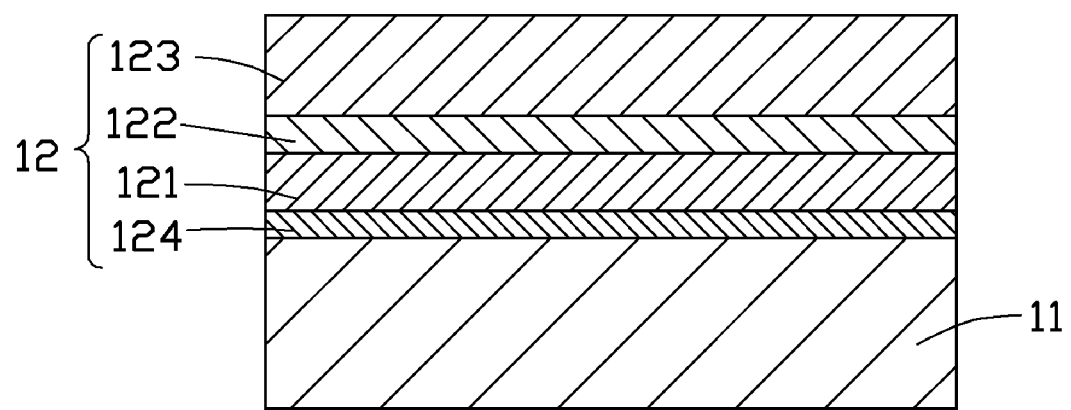
FIGS. 3 to 5 are cross-sectional views summarizing an embodiment of a method for making the metal layer and the buffer layer.
Figure 4:
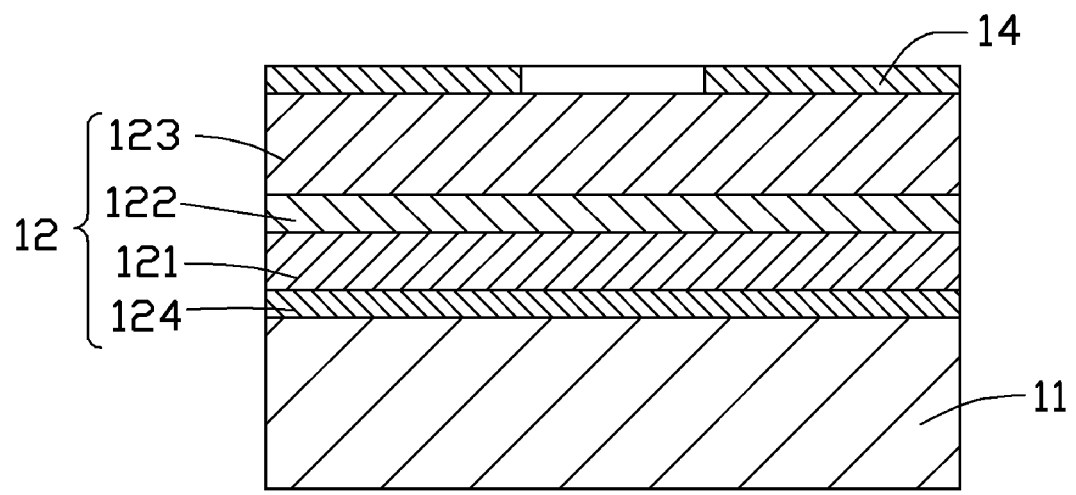
Figure 5:
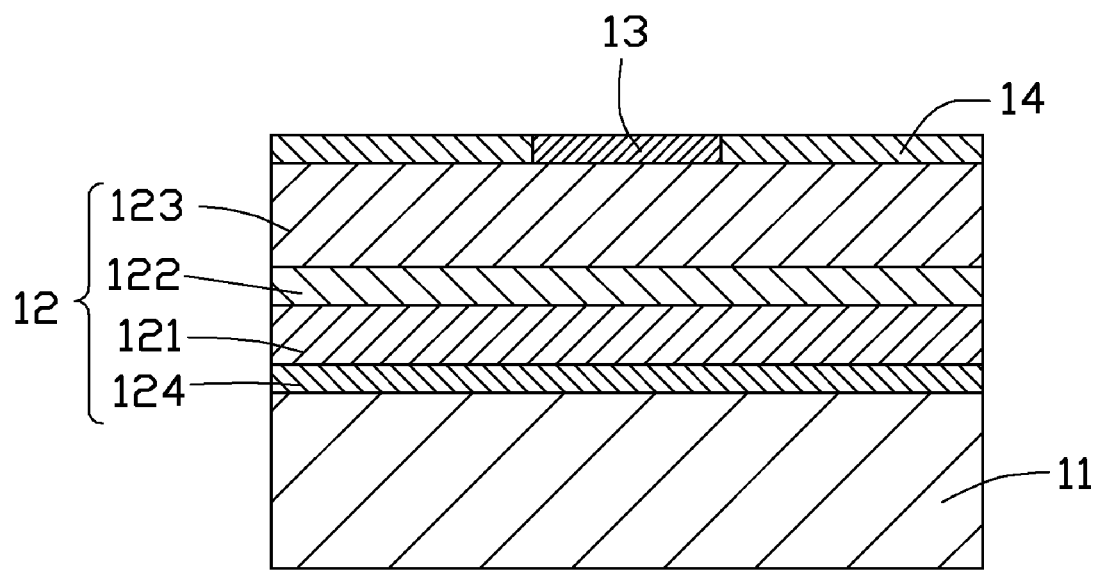

Referring to FIGS. 3 to 5, a method for making the LED 100 includes following steps.

Referring to FIG. 3, an LED chip including a heat conductive substrate 11 and a light emitting structure 12 is provided. The light emitting structure 12 includes a p-type GaN layer 121, an active layer 122 and an n-type GaN layer 123. The p-type GaN layer 121 is adjacent to the substrate 11. The LED chip can be formed by following steps. First provide a sapphire substrate, and then form the light emitting structure 12, which includes the n-type GaN layer 123, the active layer 122 and the p-type GaN layer 121 sequentially stacked on the sapphire substrate. After that, attach a heat conductive substrate 11 on the p-type GaN layer 121 and remove the sapphire substrate. In this embodiment, the light emitting structure 12 further includes a reflective layer 124 formed between the p-type GaN layer 121 and the substrate 11.

Referring to FIG. 4, a buffer layer 14 is formed on the n-type GaN layer 123. The buffer layer 14 covers a peripheral portion of the top surface of the n-type GaN layer 123 except for a portion where a metal layer 13 will be formed. The buffer layer 14 can be made by following steps. First form a $SiO_2$ mask covering the centre portion of the n-type GaN layer 123, and then deposit the buffer layer 14 on the surface of the n-type GaN layer 123 without the $SiO_2$ mask by PECVD. After that, remove the $SiO_2$ mask. A thickness of the buffer layer 14 is in the range from 0.1 µm to 0.3 µm. The buffer layer 14 forms an ohmic connection with the n-type GaN layer 123.

Referring to FIG. 5, the metal layer 13 is formed on the n-type GaN layer 123. The metal layer 13 covers the central portion of the top surface of the n-type GaN layer 123. The metal layer 13 can be formed by steps similar to forming the buffer layer 14. First, form a $SiO_2$ mask covering the surface of the buffer layer 14. And then, deposit the metal layer 13 on the central portion of the top surface of the n-type GaN layer 123 without the $SiO_2$ mask. After that, remove the $SiO_2$ mask. The metal layer 13 forms a Schottky connection with the n-type GaN layer 123 and the thickness of the metal layer 13 is in the range from 0.1 µm to 0.3 µm.

After the formation of the metal layer 13 and the buffer layer 14, deposit an IZO film on the metal layer 13 and the buffer layer 14 to form a transparent conductive layer 15. And then, deposit a gold compound on the transparent conductive layer 15 to form an electrode pad 16.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for making a light emitting diode, comprising:
   providing a light emitting diode chip which comprises a heat conductive substrate and a light emitting structure formed on the heat conductive substrate;
   forming a metal layer and a buffer layer on a top surface of the light emitting structure away from the heat conductive substrate, wherein the metal layer is set on a central portion of the top surface of the light emitting structure and forms a Schottky connection with the light emitting structure, and the buffer layer surrounds the metal layer and forms an ohmic connection with the light emitting structure;
   forming a transparent conductive layer on the metal layer and the buffer layer; and
   depositing an electrode pad on a central portion of a top surface of the transparent conductive layer.

2. The method of claim 1, wherein the metal layer and the buffer layer are formed on the top surface of the light emitting structure by Plasma Enhanced Chemical Vapor Deposition.

3. The method of claim 1, wherein the light emitting diode chip is provided by following steps:
   providing a sapphire substrate;
   forming the light emitting structure on the sapphire substrate;
   attaching a heat conductive substrate on the light emitting structure at a opposite side to the sapphire substrate; and
   removing the sapphire substrate.

4. The method of claim 1, wherein a material of the metal layer is selected from the group consisting of copper, tin, zinc, nickel, aluminum and an alloy thereof.

5. The method of claim 1, wherein a material of the buffer layer is made of titanium or titanium oxide.

\* \* \* \* \*